(12) United States Patent
Porob et al.

(10) Patent No.: US 11,149,195 B2
(45) Date of Patent: Oct. 19, 2021

(54) COATED RED LINE EMITTING PHOSPHORS

(71) Applicant: Current Lighting Solutions, LLC, East Cleveland, OH (US)

(72) Inventors: Digamber Gurudas Porob, Bangalore (IN); Prasanth Kumar Nammalwar, Bangalore (IN); Srinidhi Ramachandra, Bangalore (IN); Matthew David Butts, Rexford, NY (US); James Edward Murphy, Niskayuna, NY (US)

(73) Assignee: CURRENT LIGHTING SOLUTIONS, LLC, East Cleveland, OH (US)

( * ) Notice: Subject to any disclaimer, the term of this patent is extended or adjusted under 35 U.S.C. 154(b) by 240 days.

(21) Appl. No.: 16/348,763

(22) PCT Filed: Nov. 15, 2017

(86) PCT No.: PCT/US2017/061702
§ 371 (c)(1),
(2) Date: May 9, 2019

(87) PCT Pub. No.: WO2018/093832
PCT Pub. Date: May 24, 2018

(65) Prior Publication Data
US 2019/0292448 A1    Sep. 26, 2019

(30) Foreign Application Priority Data
Nov. 17, 2016  (IN) .............................. 201641039267

(51) Int. Cl.
*C09K 11/02*    (2006.01)
*C09K 11/61*    (2006.01)
(Continued)

(52) U.S. Cl.
CPC ............ *C09K 11/025* (2013.01); *C09K 11/02* (2013.01); *C09K 11/57* (2013.01); *C09K 11/613* (2013.01); *C09K 11/617* (2013.01); *H01L 33/502* (2013.01)

(58) Field of Classification Search
CPC ....... C09K 11/57; C09K 11/617; C09K 11/02; C09K 11/025; H01L 33/502
See application file for complete search history.

(56) References Cited

U.S. PATENT DOCUMENTS 4,829,188 A     5/1989  Shinomiya et al.
8,057,706 B1 *  11/2011 Setlur .................... C09K 11/02
                                                    252/301.4 H
(Continued)

FOREIGN PATENT DOCUMENTS

CN        103003388 A     3/2013
JP        2011012091 A    1/2011
(Continued)

OTHER PUBLICATIONS

"International Search Report and Written Opinion" dated Sep. 18, 2018 (Sep. 18, 2018), for PCT Application No. PCT/US2017/061702, 8pp.

(Continued)

*Primary Examiner* — C Melissa Koslow
(74) *Attorney, Agent, or Firm* — Buckley, Maschoff & Talwalkar LLC (57) ABSTRACT

A process for coating a phosphor of formula I: $A_x[MF_y]$:$Mn^{4+}$ includes combining the phosphor of formula I in particulate form with a first solution including a compound of formula II: $A_x[MF_y]$ to form a suspension and combining a second solution with the suspension, the second solution including a precursor including an element selected from the group consisting of calcium, strontium, magnesium, yttrium, barium, scandium, lanthanum, and combinations (Continued)

thereof. A population of particles having a core including a phosphor of formula I and a manganese-free composite coating disposed on the core, and a lighting apparatus (10) including the population of particles are also presented.

21 Claims, 2 Drawing Sheets

(51) Int. Cl.
*H01L 33/50* (2010.01)
*C09K 11/57* (2006.01)

(56) References Cited

U.S. PATENT DOCUMENTS

| | | | | |
|---|---|---|---|---|
| 8,252,613 | B1* | 8/2012 | Lyons | C09K 11/617 438/46 |
| 9,676,999 | B2* | 6/2017 | Emoto | H01L 33/501 |
| 9,680,099 | B2* | 6/2017 | Maehara | H01L 51/0003 |
| 2013/0343997 | A1 | 12/2013 | Kennedy et al. | |
| 2014/0208066 | A1* | 7/2014 | Bradbury | G06F 9/30098 712/7 |
| 2014/0327026 | A1 | 11/2014 | Murphy et al. | |
| 2015/0061488 | A1* | 3/2015 | Yoshida | H01L 33/502 313/503 |
| 2016/0024378 | A1 | 1/2016 | Murphy | |
| 2016/0160122 | A1 | 6/2016 | You et al. | |

FOREIGN PATENT DOCUMENTS

| | | |
|---|---|---|
| JP | 2016517464 A | 6/2016 |
| JP | 2016534199 A | 11/2016 |
| TW | 201602310 A | 1/2016 |
| TW | 201621029 A | 6/2016 |
| WO | 2007/064416 A1 | 6/2007 |
| WO | 2012/015581 A1 | 2/2012 |

OTHER PUBLICATIONS

Supplementary European Search Report dated Apr. 23, 2020 which was issued in connection with EP Patent Application No. 17871746.8 which was filed on Nov. 15, 2017.
Office Action for JP Patent Application No. 2019524348 dated Jul. 31, 2020.
Office Action dated Apr. 23, 2021 which was issued in connection with Taiwan Application No. 106139674 which was filed on Nov. 16, 2017.

* cited by examiner

COATED RED LINE EMITTING PHOSPHORS

BACKGROUND

Solid state lighting based on phosphor down conversion of light emitting devices have begun to replace traditional fluorescent and incandescent lamps. These colored semiconductor light emitting devices, including light emitting diodes and lasers (both are generally referred to herein as LEDs), have been usually produced from semiconductors such as gallium nitride (GaN) or indium gallium nitride (InGaN). Light emitted from GaN-based LEDs is generally in the UV and/or blue range of the electromagnetic spectrum. Light emitted from the LED is converted to light that is useful for illumination purposes by coating or covering the LED with a phosphor layer. By interposing a phosphor excited by the radiation generated by the LED, light of a different wavelength, e.g., in the visible range of the spectrum, may be generated. Colored phosphors produce custom colors and higher luminosity, and, in combination with LED generated light, phosphor generated light may be used to produce white light. The most popular white LEDs are based on blue emitting InGaN chips. The blue emitting chips may be coated with a phosphor or blend of phosphors that convert some of the blue radiation to a complementary color, e.g. a yellow-green emission. LEDs that emit in the near UV region (405 nm) may be coated with a phosphor blend that includes a blue or blue-green emitting phosphor and a red-emitting phosphor. The total of the light from the phosphor and the LED chip provides a color point with corresponding color coordinates (x and y) and correlated color temperature (CCT), and its spectral distribution provides a color rendering capability, measured by the color rendering index (CRI).

While the efficacy and CRI of LEDs using red-emitting manganese doped phosphors can be quite high, the potential limitations may be color instability and non-uniformity due to their susceptibility to degradation under high temperature and humidity (HTHH) conditions. It may be possible to reduce the color instability issue of the red-emitting manganese doped phosphors using post-synthesis processing steps, as described in U.S. Pat. No. 8,252,613. However, there is a continued demand for red-emitting phosphor compositions with improved stablity that may be used as components, individually or as part of a phosphor blend, in manufacturing LEDs and other light sources. Such phosphor compositions would allow a wider array of light sources with desirable properties including good color quality (CRI>80), a large range of color temperatures, and a relative insensitivity to temperature changes.

BRIEF DESCRIPTION

In one aspect, the present invention relates to processes for coating a phosphor of formula I: $A_x[MF_y]:Mn^{4+}$. The process includes combining a phosphor of formula I in particulate form with a first solution comprising a compound of formula II to form a suspension; and combining a second solution with the suspension, the second solution comprising a precursor comprising an element selected from the group consisting of calcium, strontium, magnesium, barium, yttrium, scandium, lanthanum, and combinations thereof, $$A_x[MF_y]:Mn^{4+} \quad (I)$$

$$A_x[MF_y] \quad (II)$$

wherein

A is Li, Na, K, Rb, Cs, or a combination thereof;

M is Si, Ge, Sn, Ti, Zr, Al, Ga, In, Sc, Hf, Y, La, Nb, Ta, Bi, Gd, or a combination thereof;

x is an absolute value of a charge of the $[MF_y]$ ion; and y is 5, 6 or 7.

In particular embodiments, the phosphor of formula I is $K_2[SiF_6]:Mn^{4+}$.

In another aspect, the present invention relates to a phosphor composition including a population of particles having a core including a phosphor of formula I and a manganese-free composite coating disposed on the core; the manganese-free composite coating includes a compound of formula II and a metal fluoride selected from the group consisting of calcium fluoride, strontium fluoride, magnesium fluoride, yttrium fluoride, barium fluoride, scandium fluoride, lanthanum fluoride and combinations thereof.

DRAWINGS

These and other features, aspects, and advantages of the present disclosure will become better understood when the following detailed description is read with reference to the accompanying drawings, wherein.

DETAILED DESCRIPTION

In the following specification and the claims, the singular forms "a", "an" and "the" include plural referents unless the context clearly dictates otherwise. As used herein, the term "or" is not meant to be exclusive and refers to at least one of the referenced components being present and includes instances in which a combination of the referenced components may be present, unless the context clearly dictates otherwise.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value.

Unless defined otherwise, technical and scientific terms used herein have the same meaning as is commonly understood by one of skill in the art to which this invention belongs. The terms "comprising," "including," and "having" are intended to be inclusive, and mean that there may be additional elements other than the listed elements. The terms "first", "second", and the like, as used herein do not denote any order, quantity, or importance, but rather are used to distinguish one element from another.

Any numerical values recited herein include all values from the lower value to the upper value in increments of one unit provided that there is a separation of at least 2 units between any lower value and any higher value. As an example, if it is stated that the amount of a component or a value of a process variable such as, for example, temperature, pressure, time and the like is, for example, from 1 to 90, or 20 to 80, it is intended that values such as 15 to 85, 22 to 68, 43 to 51, 30 to 32 etc. are expressly enumerated in this specification. For values, which are less than one, one unit is considered to be 0.0001, 0.001, 0.01 or 0.1 as appropriate. These are only examples of what is specifically intended and all possible combinations of numerical values between the lowest value and the highest value enumerated are to be considered to be expressly stated in this application in a similar manner.

As used herein, the terms "phosphor", "phosphor composition", or "phosphor material" may be used to denote both a single phosphor composition as well as blends of two or more phosphors. As used herein, the terms "lamp", "lighting apparatus", or "lighting system" refer to any source of visible and ultraviolet light, which can be generated by at least one light emitting element producing a light emission when energized, for example, a phosphor material or a light emitting diode.

Some embodiments provide a process for coating a phosphor of formula I: $A_x[MF_y]:Mn^{4+}$. The process includes combining the phosphor of formula I in particulate form with a first solution including a compound of formula II: $A_x[MF_y]$ to form a suspension and combining a second solution to the suspension. The second solution includes a precursor including an element selected from the group consisting of calcium, strontium, magnesium, barium, yttrium, scandium, lanthanum, and combinations thereof; the precursor may additionally include an anion selected from halide, hydroxide, nitrate, acetate, $MF_y$ or a combination thereof. In some embodiments, the process may result in coated phosphor particles having a core including the phosphor of formula I and a manganese-free composite coating disposed on the core. In the context of the present invention, the term "precursor" means that at least a part of the compound or compounds included as the precursor in the second solution are incorporated in the manganese-free composite coating. The manganese-free composite coating includes the compound of formula II and a metal fluoride selected from the group consisting of calcium fluoride, strontium fluoride, magnesium fluoride, yttrium fluoride, barium fluoride, scandium fluoride, lanthanum fluoride, and combinations thereof.

Both the phosphor of formula I and the compound of formula II are complex fluorides. More specifically, the phosphor of formula I is a manganese ($Mn^{4+}$) doped complex fluoride. In the context of the present disclosure, the terms "complex fluoride" and "complex fluoride phosphor" refer to a coordination compound, having a host lattice containing one coordination center (at least M or manganese), surrounded by fluoride ions acting as ligands, and charge-compensated by counter ions (A) as necessary. For example, in $K_2[SiF_6]$, the coordination center is Si and the counter ion is K. Complex fluorides are occasionally written down as a combination of binary fluorides but such a representation does not indicate the coordination number for the ligands around the coordination center. The square brackets (occasionally omitted for simplicity) indicate that the complex ion they encompass is a new chemical species, different from the simple fluoride ion.

The counter ion A in formula I and formula II, is Li, Na, K, Rb, Cs, or a combination thereof. In certain embodiments, A is Na, K, or a combination thereof. The coordination center M is Si, Ge, Ti, Zr, Hf, Sn, Al, Ga, In, Sc, Y, Bi, La, Gd, Nb, Ta, or a combination thereof. In some embodiments, M is Si, Ge, Ti, or a combination thereof. In certain embodiments, A is K, and M is Si.

Suitable examples of the compound of formula II include $K_2[SiF_6]$, $K_2[TiF_6]$, $K_2[SnF_6]$, $Cs_2[TiF_6]$, $Rb_2[TiF_6]$, $Cs_2[SiF_6]$, $Rb_2[SiF_6]$, $Na_2[TiF_6]$, $Na_2[ZrF_6]$, $K_3[ZrF_7]$, $K_3[BiF_7]$, $K_3[YF_7]$, $K_3[LaF_7]$, $K_3[GdF_7]$, $K_3[NbF_7]$ and $K_3[TaF_7]$. In certain embodiments, the compound of formula II is $K_2SiF_6$.

In the phosphor of formula I, for example $Mn^{4+}$ doped complex fluoride phosphor such as $K_2SiF_6:Mn^{4+}$, a doped element that is, manganese (Mn) acts as an additional coordination center, substituting a part of the coordination center, for example, Si. The doped element 'Mn' is referred to as a 'dopant' or an 'activator.' The terms "doped ion" or "activator ion", as used herein, refers to an ion (for example $Mn^{4+}$) doped in a complex fluoride that forms luminescent center and is responsible for the luminescence of the phosphor of formula I. The host lattice (including the counter ions) may further modify the excitation and emission properties of the activator ion.

Suitable examples of the phosphor of formula I include $K_2[SiF_6]:Mn^{4+}$, $K_2[TiF_6]:Mn^{4+}$, $K_2[SnF_6]:Mn^{4+}$, $Cs_2[TiF_6]:Mn^{4+}$, $Rb_2[TiF_6]:Mn^{4+}$, $Cs_2[SiF_6]:Mn^{4+}$, $Rb_2[SiF_6]:Mn^{4+}$, $Na_2[TiF_6]:Mn^{4+}$, $Na_2[ZrF_6]:Mn^{4+}$, $K_3[ZrF_7]:Mn^{4+}$, $K_3[BiF_7]:Mn^{4+}$, $K_3[YF_7]:Mn^{4+}$, $K_3[LaF_7]:Mn^{4+}$, $K_3[GdF_7]:Mn^{4+}$, $K_3[NbF_7]:Mn^{4+}$ or $K_3[TaF_7]:Mn^{4+}$. In certain embodiments, the phosphor of formula I is $K_2SiF_6:Mn^{4+}$.

In some embodiments, the amount of manganese in the phosphor of formula I ranges from about 0.3 weight percent (wt %) to about 4.9 wt %, (from about 1.2 mole percent (mol %) to about 20 mol %), based on total weight of the phosphor of formula I. In some embodiments, the amount of manganese in the phosphor of formula I ranges from about 0.3 weight percent (wt %) to about 3.9 wt %, (from about 1.2 mole percent (mol %) to about 16 mol %). In some embodiments, the amount of manganese in the phosphor of formula I ranges from about 0.3 weight percent (wt %) to about 2.5 wt %, (from about 1.2 mole percent (mol %) to about 10 mol %). In some embodiments, the amount of manganese ranges from about 0.50 wt % to about 0.85 wt % (from about 2 mol % to about 3.4 mol %), and in certain embodiments, from about 0.65 wt % to about 0.75 wt % (from about 2.6 mol % to about 3 mol %). In some other embodiments, the amount of manganese ranges from about 0.75 wt % to about 2.5 wt % (about 3 mol % to about 10 mol %). In some embodiments, the amount of manganese ranges from about 0.9 wt % to about 1.5 wt % (from about 3.5 mol % to about 6 mol %), and in certain embodiments, from about 0.9 wt % to about 1.4 wt % (about 3.0 mol % to about 5.5 mol %).

The phosphor of formula I may have a particle size distribution having a D50 particle size in a range from about 10 microns to about 80 microns. In some embodiments, it is desirable to use particles of small particle size, for example a D50 particle size of less than 30 microns, particularly 20-30 microns. In some embodiments, the phosphor of formula I has D50 particle size in a range from about 10 microns to about 20 microns. In particular embodiments, the phosphor of formula I has D50 particle size in a range from about 12 microns to about 18 microns.

In some embodiments, the phosphor of formula I is treated to enhance performance and stability (quantum efficiency, thermal stability, humidity stability, flux stability, and color stability) of the phosphor of formula I. In one embodiment, the phosphor of formula I in particulate form is contacted with a fluorine-containing oxidizing agent in gaseous form at an elevated temperature. Various details of the process of contacting the phosphor of formula I in particulate form with the fluorine-containing oxidizing agent is described below.

In some embodiments, the first solution includes a solution of the compound of formula II in aqueous hydrofluoric acid. The first solution may be prepared by dissolving the compound of formula II in aqueous hydrofluoric acid. A concentration of aqueous hydrofluoric acid used in the first solution may range from about 20 weight percent (wt %) to about 70 wt %. In some embodiments, the first solution includes aqueous hydrofluoric acid having a concentration in a range from about 30 wt % to about 60 wt %. A small quantity of other acids may be included in the first solution if desired, such as hexafluorosilicic acid. In some embodiments, the first solution is a saturated solution of the compound of formula II in aqueous hydrofluoric acid. In certain embodiments, the first solution is a saturated solution of $K_2SiF_6$ in aqueous hydrofluoric acid.

The precursor includes an alkaline-earth cation, a rare-earth cation, or a combination thereof, particularly calcium, strontium, magnesium, barium, yttrium, lanthanum, or a combination thereof. The precursor additionally includes an anion selected from halide, hydroxide, nitrate, acetate, $MF_y$, or combinations thereof. Suitable examples of the precursor include a calcium halide, strontium halide, magnesium halide, yttrium halide, lanthanum halide, calcium hydroxide, strontium hydroxide, magnesium hydroxide, yttrium hydroxide, lanthanum hydroxide, calcium nitrate, strontium nitrate, magnesium nitrate, yttrium nitrate, lanthanum nitrates, calcium acetate, strontium acetate, magnesium acetate, yttrium acetate, lanthanum acetate, $MgSiF_6$, $SrSiF_6$, $BaSiF_6$, and $CaSiF_6$. In certain embodiments, the precursor is calcium chloride, strontium chloride, magnesium chloride, yttrium chloride, lanthanum chloride, $MgSiF_6$, $CaSiF_6$, or a combination thereof.

In particular embodiments, the process includes combining K2SiF6:Mn4+ in particulate form with a first solution comprising $K_2SiF_6$ and hydrofluoric acid to form a suspension; and combining a second solution with the suspension. The second solution includes a precursor selected from the group consisting of calcium chloride, strontium chloride, magnesium chloride, lanthanum chloride, yttrium chloride, scandium chloride, $MgSiF_6$, $CaSiF_6$, and combinations thereof.

In some embodiments, the second solution includes an organic solvent. The second solution may be prepared by dissolving the precursor in a suitable amount in the organic solvent. The precursor may have a solubility higher than 75 percent in the organic solvent. In some embodiments, the precursor has a solubility higher than 80 percent in the organic solvent. Suitable examples of the organic solvents include methanol, ethanol, isopropyl alcohol, dimethylsulfoxide, acetonitrile, or combinations thereof.

In other embodiments, the second solution is an aqueous solution, that is, a solution free of an organic solvent. Accordingly, the process may include combining $K_2SiF_6$:$Mn^{4+}$ in particulate form with a first solution that includes $K_2SiF_6$ and hydrofluoric acid, to form a suspension; and combining a second solution that includes a precursor with the suspension. Both the first and second solutions are free of an organic solvent.

The amounts of the constituents i.e., the compound of formula II and the precursor in the corresponding first and second solutions, and concentrations of the reactants in the solutions, are suitable for carrying out the desirable chemical reaction, and thereby forming a desirable composite coating on the particles of the phosphor of formula I (i.e., coated phosphor particles with composite coating). In embodiments where the second solution includes an organic solvent, the molar ratio of the precursor in the second solution to the compound of formula II in the first solution is in a range from about 1:5 to about 1:10. In some embodiments, the molar ratio of the precursor in the second solution to the compound of formula II in the first solution is in a range from about 1:1 to about 1:3.

In an exemplary aqueous system where the second solution is free of an organic solvent, the phosphor of formula I is $K_2SiF_6$:$Mn^{4+}$ and the precursor of the second solution includes the $SiF_6$ anion. Concentration of the phosphor in the first solution ranges from about 1 gram in 5 ml solution to about 1 gram in 30 ml solution. The volume ratio of the second solution to the first solution ranges from about 1:49 to about 20:30, preferably from about 4:46 to about 15:35 (vol/vol). Concentration of the precursor in the second solution ranges from about 0.4M to a saturated solution (<0.9M at about 20° C.), preferably from about 0.6M-0.9M.

As noted, the process includes combining the phosphor of formula I in particulate form to the first solution to form a suspension. In some embodiments, the process further includes forming the first solution prior to combining the phosphor of formula I with the first solution. In these instances, the process includes forming the first solution by dissolving the compound of formula II in aqueous hydrofluoric acid. In certain embodiments, the first solution is prepared by dissolving $K_2SiF_6$ in aqueous hydrofluoric acid to form a saturated solution. In some embodiments, the process includes adding the phosphor of formula I in particulate form to the saturated solution to form the suspension. Various materials of the compound of formula II and the phosphor of formula I are discussed previously.

In some embodiments, the process further includes contacting the phosphor of formula I in particulate form with a fluorine-containing oxidizing agent in gaseous form at an elevated temperature, prior to combining the phosphor of formula I in particulate form with the first solution, or after the coated phosphor is formed. The fluorine-containing oxidizing agent may include $F_2$, HF, $SF_6$, $BrF_5$, $NH_4HF_2$, $NH_4F$, KF, $AlF_3$, $SbF_5$, $ClF_3$, $BrF_3$, KrF, $XeF_2$, $XeF_4$, $NF_3$, $SiF_4$, $PbF_2$, $ZnF_2$, $SnF_2$, $CdF_2$ or combinations thereof. In particular embodiments, the fluorine-containing oxidizing agent is $F_2$. The amount of oxidizing agent in an atmosphere may be varied to obtain the stable phosphor particles, particularly in conjunction with variation of time and temperature. Where the fluorine-containing oxidizing agent is $F_2$, the atmosphere may include at least 0.5% $F_2$, although a lower concentration may be effective in some embodiments. In particular, the atmosphere may include at least 5% $F_2$ and more particularly, at least 20% $F_2$. The atmosphere may additionally include nitrogen, helium, neon, argon, krypton, xenon, in any combination with the fluorine-containing oxidizing agent. In a particular embodiment, the atmosphere is composed of about 20% $F_2$ and about 80% nitrogen.

The elevated temperature at which the phosphor of formula I is contacted with the fluorine-containing oxidizing agent may be at least 100 degrees Celsius. In various embodiments, the temperature is in a range of from about 200 degrees Celsius to about 700 degrees Celsius, and more particularly, from about 350 degrees Celsius to about 600 degrees Celsius. The phosphor of formula I in particulate form is contacted with the oxidizing agent for a period of time sufficient to increase its performance and stability. Time and temperature are interrelated, and may be adjusted together, for example, increasing time while reducing temperature, or increasing temperature while reducing time. The contacting step may include multiple periods of contact, of varying time and temperature. In some embodiments, the phosphor of formula I in particulate form is contacted with the fluorine-containing oxidizing agent at a temperature of at least 250 degrees Celsius for a period of at least eight hours, for example, at about 450 degrees Celsius for about four hours and at about 560 degrees Celsius for about next four hours.

After forming the suspension, the process includes combining the second solution with the suspension. In some embodiments, the process further includes forming the second solution by dissolving a suitable amount of the precursor in the organic solvent. Various suitable precursors and organic solvents for preparing the second solution are discussed previously. For example, the second solution may be prepared by dissolving calcium chloride or strontium chloride in ethanol.

The step of combining the second solution with the suspension may be carried out with a slow rate. For example, when the second solution contains about 60 ml of an organic solvent, it may be added to the suspension drop by drop. In some embodiments, the combining step is carried out by combining the second solution with the suspension with a rate of less than 5 milliliters/minute. In some embodiments, the rate of combining the second solution with the suspension is in a range from about 0.1 milliliter/minute to about 2 milliliters/minute.

On combining the second solution with the suspension, a precipitate may start forming. As the constituents of the second solution react with the constituents of the first solution, a precipitate including the compound of formula II and a metal fluoride starts forming. The metal fluoride is the fluoride of the element that was present in the precursor. As the chemical reaction proceeds, the process may further include disposing the precipitate on the surfaces of the particles of the phosphor of formula I, and thereby forming a composite coating on the particles. In some embodiments, the composite coating includes the compound of formula II and the metal fluoride. In some embodiments, the composite coating includes nanoparticles physisorbed on the surface of the particle. In some embodiments, the chemical reaction may be carried out at an elevated temperature, for example up to about 100 degrees Celsius. In certain embodiments, the chemical reaction is carried out at room temperature (~25 degrees Celsius).

The particulate form of the phosphor of formula I may include particles of variable particle size i.e, a wide range of particle size. The suspension may have a population of larger particles in a portion that is closer to a bottom of a container as compared to a population of smaller particles in another portion that is comparatively far from the bottom of the container. In some embodiments, the process includes combining the second solution with the suspension at the bottom of the container for example, using a pipette. This may help in forming the precipitate in the portion of the suspension close to the bottom of the container and coating substantially all the particles including larger particles that often have tendency to stay at the bottom.

In some embodiments, during the step of combining the second solution with the suspension, the suspension is subjected to an agitated motion. In some instances, the agiated motion refers to stirring of the suspension. In some embodiments, the process includes continuously subjecting the suspension to the agitated motion for the entire step of combining the second solution with the suspension. The agitated motion may enable the disposition the formed precipitate on substantially all the particles of the phosphor of formula I, and thereby form coated particles of the phosphor of formula I with the composite coating. The agitated motion of the suspension may ensure the continuous movement of the particles of the phosphor of formula I in the suspension so that substantially all particles (large and small) of the phosphor of formula I are coated with the composite coating.

The process may further include filtering the suspension after completing the step of combining the second solution with the suspension to obtain the product particles. The process may further include washing the product particles followed by drying to obtain coated particles of the phosphor of formula I. In some embodiments, the process thereby includes forming coated particles of the phosphor of formula I with a composite coating. In some embodiments, the coated particles of the phosphor of formula I are obtained in powder form.

The thickness of the composite coating and the particle size in the composition of the composite coating may depend on various process parameters, for example, one or more of the amounts of the constituents of the first solution and the second solution and the rate of combining the second solution with the suspension, and may be controlled by tailoring these parameters.

Some embodiments provide a process for coating particles of a phosphor of formula $K_2[SiF_6]:Mn^{4+}$. The process includes combining $K_2SiF_6:Mn^{4+}$ in particulate form with a first solution including $K_2SiF_6$ and hydrofluoric acid to form a suspension and combining a second solution with the suspension. The first solution may include a saturated solution of $K_2SiF_6$ in aqueous hydrofluoric acid. The second solution may include ethanol and a precursor selected from the group consisting of calcium chloride, strontium chloride, magnesium chloride, barium chloride, yttrium chloride, lanthanum chloride, and combinations thereof. The other process details are described hereinabove.

Some embodiments are directed to a phosphor composition including a population of particles having a core including a phosphor of formula I and a manganese-free composite coating disposed on the core. In some embodiments, the cores of the population of particles are particles of the phosphor of formula I. In some embodiments, an amount of the manganese-free composite coating relative to the phosphor of formula I in the core ranges from 1-20%, wt/wt. In some embodiments, an amount of the manganese-free composite coating relative to the phosphor of formula I in the core ranges from 5-15%, wt/wt The manganese-free composite coating includes a compound of formula II and a metal fluoride selected from the group consisting of calcium fluoride, strontium fluoride, magnesium fluoride, yttrium fluoride, scandium fluoride, barium fluoride, lanthanum fluoride, and combinations thereof. The terms "manganese-free composite coating" and "composite coating" may be used interchangeably throughout the specification. In embodiments where an organic solvent is used, a molar ratio of the metal fluoride to the compound of formula II in the composite coating is in a range from about 1:6 to about 1:3. The composite coating may be composed of nanoparticles having an average particle size in a range from about 10 nanometers to about 200 nanometers. In some embodiments, the nanoparticles have an average particle size in a range from about 50 nanometers to about 100 nanometers. In some embodiments, the population of particles may be prepared by the process as described hereinabove.

The composite coating may be disposed uniformly on the core including the phosphor of formula I. As used herein, the term "disposed uniformly" means that the composite coating is covering substantially entire surface of the core. In some embodiments, the composite coating is covering more than 80 percent of the entire surface of the core.

The composite coating may protect the cores including the phosphor of formula I (e.g., particles of the phosphor of formula I) from degradation. The coated particles of the phosphor of formula I with the composite coating have a stability higher than that of the particles of the phosphor of formula I (i.e., uncoated particles). Stability of phosphor particles (coated or uncoated) may refer to stability of the phosphor particles in a high temperature and high humidity environment. Generally, stability of a phosphor material may be analyzed by measuring a change in quantum efficiency of the phosphor material after exposing the phosphor material to the high temperature and high humidity environment. As used herein, the term "high temperature and high humidity environment" refers to an environment having at least 85 percent relative humidity (with respect to an environment having no humidity) and temperature of at least of 85 degrees Celsius. In some embodiments, a change in quantum efficiencies after exposing the coated particles of the phosphor of formula I with the composite coating is lower than that of a change in quantum efficiencies of the particles of the phosphor of formula I. The coated particles of the phosphor of formula I with the composite coating may have a stability improved by two orders of magnitude higher than the stability of particles of the phosphor of formula I in the high temperature and high humidity environment.

Some embodiments are directed to a lighting apparatus that includes a phosphor composition radiationally coupled to a semiconductor light source. The phosphor composition includes a population of particles having a core including the phosphor of formula I and a manganese-free composite coating disposed on the core (as described hereinabove). In one embodiment, the semiconductor light source can be a light emitting diode (LED) light source. Radiationally coupled means that radiation from the semiconductor light source is transmitted to the phosphor composition, and the phosphor composition emits radiation of a different wavelength. A combination of the light from the semiconductor light source and the light emitted from the phosphor composition may be used to produce a desired color emission or white light. For example, a light emitting LED device may be based on a blue emitting InGaN LED chip. The blue emitting LED chip may include a layer including the phosphor composition to convert some of the blue radiation to a complementary color, e.g. a red emission or a white emission.

Figure 1:
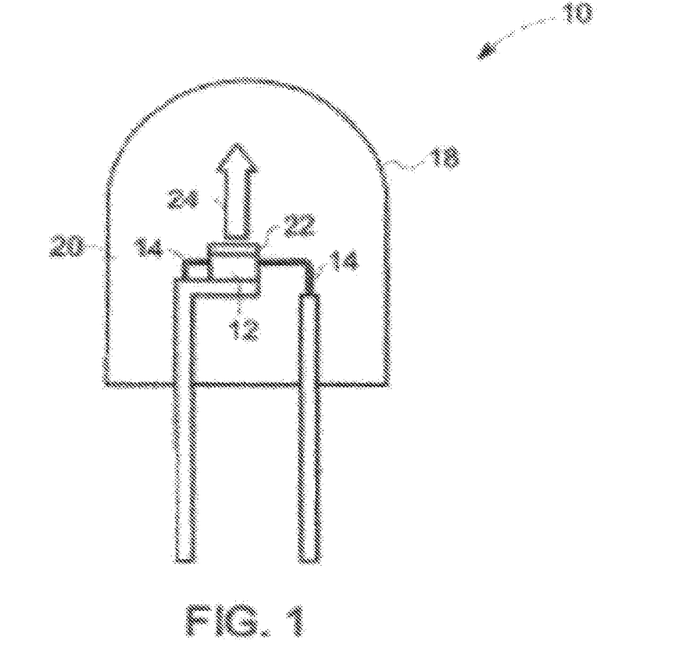
FIG. 1 is a schematic cross-sectional view of a lighting apparatus, in accordance with one embodiment.

FIG. 1 illustrates a lighting apparatus or lamp 10, in accordance with some embodiments. The lamp 10 includes a light emitting diode (LED) chip 12, and leads 14 electrically attached to the LED chip. The leads 14 provide current to LED chip 12 and thus cause it to emit radiation. The LED chip 12 may be any semiconductor blue or ultraviolet light source, for example based on a nitride compound semiconductor of formula $In_iGa_jAl_kN$ (where $0 \le i$; $0 \le j$; $0 \le k$ and $i+j+k=1$) having an emission wavelength greater than about 250 nanometers and less than about 550 nanometers. In certain embodiments, the LED chip 12 may be a blue emitting LED chip having a peak emission wavelength from about 400 nanometers to about 500 nanometers. In the lamp 10, a phosphor composition 22 (as described in the above embodiments) is disposed on a surface of the LED chip 12, and is radiationally coupled to the chip 12. The phosphor composition 22 can be deposited on the surface of the LED 12 by any appropriate method known in the art. The light emitted by the LED chip 12 mixes with the light emitted by the phosphor composition 22 to produce the desired emission (indicated by arrow 24).

Although the general discussion of the example structures of the lighting apparatus discussed herein are directed toward inorganic LED based light sources, it should be understood that the LED chip may be replaced by an organic light emissive structure or other radiation source, unless otherwise noted, and that any reference to an LED chip or semiconductor is merely representative of any appropriate radiation source.

With continued reference to FIG. 1, the LED chip 12 may be encapsulated within an envelope 18, which encloses the LED chip 12 and an encapsulant material 20. The envelope 18 may be, for example, glass or plastic. The LED chip 12 may be enclosed by the encapsulant material 20. The encapsulant material 20 may be a low temperature glass, a polymer, an epoxy or a suitable resin known in the art, for example, a silicone or epoxy resin. In an alternative embodiment, the lamp 10 may only include the encapsulant material 20 without an outer envelope 18.

The lighting apparatus 10 may also include a plurality of particles (not shown) to scatter or diffuse the emitted light. These scattering particles would generally be embedded in the encapsulant 20. The scattering particles may include, for example, particles made from $Al_2O_3$ (alumina) or $TiO_2$ (titania). The scattering particles may effectively scatter the light emitted from the LED chip 12, preferably with a negligible amount of absorption.

Various other configurations of the lamp 10 may be known in the art. For example, in some embodiments, the phosphor composition may be interspersed within the encapsulant material 20, instead of being disposed directly on the LED chip 12 (referring to FIG. 1). In some other embodiments, the phosphor composition may be coated onto a surface of the envelope 18, instead of being formed over the LED chip 12. Moreover, in some embodiments, the lamp 10 may include a plurality of LED chips (not shown). These various configurations may be combined, with the phosphor composition located in any two or all three locations or in any other suitable location, such as separately from the envelope 18 or integrated into the LED chip 12. Further, different phosphor compositions may be used in different parts of the lamp 10.

By use of the phosphor compositions described herein in some embodiments, lamps can be provided producing red light or white light having high luminosity, and high CRI values for a low range of color temperatures of interest (2500 K to 4000 K) for general illumination.

Non-limiting examples of lighting apparatus or devices include devices for excitation by light-emitting diodes (LEDs) such as fluorescent lamps, cathode ray tubes, plasma display devices, liquid crystal displays (LCD's), UV excitation devices, such as in chromatic lamps, lamps for backlighting, liquid crystal displays (LCD), plasma screens, xenon excitation lamps, and UV excitation marking systems. The list of these devices is meant to be merely exemplary and not exhaustive. In some embodiments, a backlight device includes a lighting apparatus as described herein. The backlight device may include a surface mounted device (SMD) structure. Examples of the backlight devices include, but are not limited to, televisions, computer monitors, mobile phones, conventional telephones, digital photo frames, tablets, laptops, automotive displays, e-book readers, electronic dictionaries, gaming devices, and other handheld devices that have a display including an LED light source as described herein.

In addition to the coated particles of the phosphor of formula I, the phosphor composition may include one or more additional phosphors. When the phosphor composition is used in a lighting apparatus in combination with a blue or near-UV LED emitting radiation in the range of about 250 to 550 nm, the resultant light emitted by the lighting apparatus may be a white light. Additional phosphors such as green, blue, yellow, red, orange, or other color phosphors may be used in the phosphor composition (for example, a blend) to customize the white color of the resulting light and produce specific spectral power distributions.

Suitable additional phosphors for use in the phosphor composition include, but are not limited to:

$((Sr_{1-z}(Ca,Ba,Mg,Zn)_z)_{1-(x+w)}(Li,Na,K,Rb)_w Ce_x)_3(Al_{1-y}Si_y)O_{4+y+3(x-w)}F_{1-y-3(x-w)}$, $0<x\leq 0.10$, $0\leq y\leq 0.5$, $0\leq z\leq 0.5$, $0\leq w\leq x$;

$(Ca,Ce)_3Sc_2Si_3O_{12}$ (CaSiG);

$(Sr,Ca,Ba)_3Al_{1-x}Si_xO_{4+x}F_{1-x}:Ce^{3+}$ (SASOF));

$(Ba,Sr,Ca)_5(PO_4)_3(Cl,F,Br,OH):Eu^{2+},Mn^{2+}$;

$(Ba,Sr,Ca)BPO_5:Eu^{2+},Mn^{2+}$;

$(Sr,Ca)_{10}(PO_4)_6*nB_2O_3:Eu^{2+}$ (wherein $0<n\leq 1$); $Sr_2Si_3O_8*2SrCl_2:Eu^{2+}$;

$(Ca,Sr,Ba)_3MgSi_2O_8:Eu^{2+},Mn^{2+}$; $BaAl_8O_{13}:Eu^{2+}$; $2SrO*0.84P_2O_5*0.16B_2O_3:Eu^{2+}$;

$(Ba,Sr,Ca)MgAl_{10}O_{17}:Eu^{2+},Mn^{2+}$; $(Ba,Sr,Ca)Al_2O_4:Eu^{2+}$;

$(Y,Gd,Lu,Sc,La)BO_3:Ce^{3+},Tb^{3+}$; $ZnS:Cu^+,Cl^-$; $ZnS:Cu^+,Al^{3+}$; $ZnS:Ag^+,Cl^-$;

$ZnS:Ag^+,Al^{3+}$;

$(Ba,Sr,Ca)_2Si_{1-n}O_{4-2n}:Eu^{2+}$ (wherein $0\leq n\leq 0.2$); $(Ba,Sr,Ca)_2(Mg,Zn)Si_2O_7:Eu^{2+}$;

$(Sr,Ca,Ba)(Al,Ga,In)_2S_4:Eu^{2+}$;

$(Y,Gd,Tb,La,Sm,Pr,Lu)_3(Al,Ga)_{5-a}O_{12-3/2a}:Ce^{3+}$ (wherein $0\leq a\leq 0.5$);

$(Ca,Sr)_8(Mg,Zn)(SiO_4)_4Cl_2:Eu^{2+},Mn^{2+}$; $Na_2Gd_2B_2O_7:Ce^{3+},Tb^{3+}$;

$(Sr,Ca,Ba,Mg,Zn)_2P_2O_7:Eu^{2+},Mn^{2+}$; $(Gd,Y,Lu,La)_2O_3:Eu^{3+},Bi^{3+}$;

$(Gd,Y,Lu,La)_2O_2S:Eu^{3+},Bi^{3+}$; $(Gd,Y,Lu,La)VO_4:Eu^{3+},Bi^{3+}$; $(Ca,Sr)S:Eu^{2+},Ce^{3+}$;

$SrY_2S_4:Eu^{2+}$; $CaLa_2S_4:Ce^{3+}$; $(Ba,Sr,Ca)MgP_2O_7:Eu^{2+},Mn^{2+}$; $(Y,Lu)_2WO_6:Eu^{3+},Mo^{6+}$;

$(Ba,Sr,Ca)_bSi_gN_m:Eu^{2+}$ (wherein $2b+4g=3m$); $Ca_3(SiO_4)Cl_2:Eu^{2+}$;

$(Lu,Sc,Y,Tb)_{2-u-v}Ce_vCa_{1+u}Li_wMg_{2-w}P_w(Si,Ge)_{3-w}O_{12-u/2}$ (where $-0.5<u\leq 1$, $0<v\leq 0.1$, and $0\leq w\leq 0.2$);

$(Y,Lu,Gd)_{2-m}(Y,Lu,Gd)Ca_mSi_4N_{6+m}C_{1-m}:Ce^{3+}$, (wherein $0\leq m\leq 0.5$); (Lu,Ca,Li,Mg,Y), α-SiAlON doped with $Eu^{2+}$ and/or $Ce^{3+}$;

$(Ca,Sr,Ba)SiO_2N_2:Eu^{2+},Ce^{3-}$;

β-SiAlON:$Eu^{2-}$, $3.5MgO*0.5MgF_2*GeO_2:Mn^{4+}$;

$Ca_{1-c-f}Ce_cEu_fAl_{1-c}Si_{1-c}N_3$, (where $0\leq c\leq 0.2$, $0\leq f\leq 0.2$);

$Ca_{1-h-r}Ce_hEu_rAl_{1-h}(Mg,Zn)_hSiN_3$, (where $0\leq h\leq 0.2$, $0\leq r\leq 0.2$);

$Ca_{1-2s-t}Ce_s(Li,Na)_sEu_tAlSiN_3$, (where $0\leq s\leq 0.2$, $0\leq t\leq 0.2$, $s+t>0$); and (Sr, Ca)AlSiN$_3$:$Eu^{2-}$,$Ce^{3+}$.

Other additional materials suitable for use in phosphor composition include electroluminescent polymers such as polyfluorenes, preferably poly(9,9-dioctyl fluorene) and copolymers thereof, such as poly(9,9'-dioctylfluorene-co-bis-N,N'-(4-butylphenyl)diphenylamine) (F8-TFB); poly (vinylcarbazole) and polyphenylenevinylene and their derivatives. In addition, the phosphor composition may include a blue, yellow, orange, green or red phosphorescent dye or metal complex, or combinations thereof. Materials suitable for use as the phosphorescent dye include, but are not limited to, tris(1-phenylisoquinoline) iridium (III) (red dye), tris(2-phenylpyridine) iridium (green dye) and Iridium (III) bis(2-(4,6-difluorephenyl)pyridinato-N,C2) (blue dye). Commercially available fluorescent and phosphorescent metal complexes from ADS (American Dyes Source, Inc.) may also be used. ADS green dyes include ADS060GE, ADS061GE, ADS063GE, and ADS066GE, ADS078GE, and ADS090GE. ADS blue dyes include ADS064BE, ADS065BE, and ADS070BE. ADS red dyes include ADS067RE, ADS068RE, ADS069RE, ADS075RE, ADS076RE, ADS067RE, and ADS077RE.

In some embodiments, the additional luminescent material includes a green light emitting quantum dot (QD) material. The green light emitting QD material may include a group II-VI compound, a group III-V compound, a group IV-IV compound, a group IV compound, a group I-III-VI$_2$ compound, or a mixture thereof. Non-limiting examples of group II-VI compounds include CdSe, CdTe, CdS, ZnSe, ZnTe, ZnS, HgTe, HgS, HgSe, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, CdZnSeS, CdZnSeTe, CdZnSTe, CdHgSeS, CdHgSeTe, CdHgSTe, HgZnSeS, HgZnSeTe, HgZnSTe, or combinations thereof. Group III-V compounds may be selected from the group consisting of GaN, GaP, GaAs, AlN, AlP, AlAs, InN, InP, InAs, GaNP, GaNAs, GaPAs, AlNP, AlNAs, AlPAs, InNP, InNAs, InPAs, GaAlNP, GaAlNAs, GaAlPAs, GaInNP, GaInNAs, GaInPAs, InAlNP, InAlNAs, InAlPAs, and combinations thereof. Examples of group IV compounds include Si, Ge, SiC, and SiGe. Examples of group I-III-VI$_2$ chalcopyrite-type compounds include CuInS$_2$, CuInSe$_2$, CuGaS$_2$, CuGaSe$_2$, AgInS$_2$, AgInSe$_2$, AgGaS$_2$, AgGaSe$_2$ and combinations thereof.

QD materials for use as the additional luminescent material may be a core/shell QD, including a core, at least one shell coated on the core, and an outer coating including one or more ligands, preferably organic polymeric ligands. Exemplary materials for preparing core-shell QDs include, but are not limited to, Si, Ge, Sn, Se, Te, B, C (including diamond), P, Co, Au, BN, BP, BAs, AlN, AlP, AlAs, AlSb, GaN, GaP, GaAs, GaSb, InN, InP, InAs, InSb, AlN, AlP, AlAs, AlSb, GaN, GaP, GaAs, GaSb, ZnO, ZnS, ZnSe, ZnTe, CdS, CdSe, CdSeZn, CdTe, HgS, HgSe, HgTe, BeS, BeSe, BeTe, MgS, MgSe, MnS, MnSe, GeS, GeSe, GeTe, SnS, SnSe, SnTe, PbO, PbS, PbSe, PbTe, CuF, CuCl, CuBr, CuI, Si$_3$N$_4$, Ge$_3$N$_4$, Al$_2$O$_3$, (Al,Ga,In)$_2$(S,Se,Te)$_3$, Al$_2$CO, and appropriate combinations of two or more such materials. Exemplary core-shell QDs include, but are not limited to, CdSe/ZnS, CdSe/CdS, CdSe/CdS/ZnS, CdSeZn/CdS/ZnS, CdSeZn/ZnS, InP/ZnS, PbSe/PbS, PbSe/PbS, CdTe/CdS, and CdTe/ZnS.

The QD materials typically include ligands conjugated to, cooperated with, associated with, or attached to their surface. In particular, the QDs may include a coating layer comprising ligands to protect the QDs from environmental conditions including elevated temperatures, high intensity light, external gasses, and moisture, control aggregation, and allow for dispersion of the QDs in the host binder material.

The ratio of each of the individual luminescent material, for example coated particles of the phosphor of formula I with the composite coating and additional luminescent materials in the phosphor composition may vary depending on the characteristics of the desired light output. The relative proportions of individual luminescent materials in the phosphor composition may be adjusted such that when their emissions are blended and employed in a lighting apparatus, there is produced visible light of predetermined x and y values on the CIE chromaticity diagram created by the International Commission on Illumination (CIE). In certain embodiments, the lighting apparatus emits white light. In some embodiments, the resulting white light may possess an x value in the range of about 0.20 to about 0.55, and a y value in the range of about 0.20 to about 0.55. The exact identity and amount of each luminescent material in the phosphor composition for use in a lighting apparatus as described herein can be varied according to the needs of the end user.

EXAMPLES

The examples that follow are merely illustrative, and should not be construed to be any sort of limitation on the scope of the claimed invention. Unless specified otherwise, all ingredients and components are commercially available from common chemical suppliers.

Stability Testing in HTHH Environment

The samples were dispersed into silicone (Sylgard 184) to form corresponding slurries, and these slurries were used to make the corresponding sample tapes. Each slurry was prepared by mixing 0.7 g of the sample with 1.5 g of Sylgard 184. These slurries were tape cast followed by curing at 90 degrees Celsius for 35 min to obtain self-standing tapes.

The tapes were measured for quantum efficiency (QE) at excitation wavelength 450 nm by using a quantum efficiency measuring system. These tapes were then placed into a high temperature and high humidity (HTHH) chamber (85 degrees Celsius, 85% relative humidity). After exposure to HTHH environment for the desired period, QEs of the tapes were again measured at excitation wavelength 450 nm.

Examples 1-10

Coated Phosphor Particles With a Composite Coating: Organic Solvent $K_2SiF_6$:$Mn^{4+}$ phosphor powder was synthesized according to a procedure described in the referenced U.S. Pat. No. 7,497,973 in a HF solution with a drying temperature of about 70 degrees Celsius. The synthesized $K_2SiF_6$:$Mn^{4+}$ phosphor powder was treated using a process as described in the referenced U.S. Pat. No. 8,906,724. The amount of manganese present in $K_2SiF_6$:$Mn^{4+}$ phosphor powder was about 10 mol %.

Coating Procedure $K_2SiF_6$ powder (5 g) was dissolved in 100 ml HF (48%) to prepare a saturated solution (0.2 mol/liter). $K_2SiF_6$:$Mn^{4+}$ phosphor powder (3 g) (synthesized and treated as described above) was added to this saturated solution, and this suspension was magnetically stirred at 350 revolution per minute (rpm). Amounts of a precursor (a rare-earth compound or an alkaline-earth compound) were dissolved in different amounts of ethanol. The most uniform coatings typically were formed when the solutions were added slowly (greater than about 5 minutes) to the suspension. A solution of the precursor was added to the suspension (having $K_2SiF_6$:$Mn^{4+}$ phosphor powder dispersed in the saturated solution) at a rate of 2 milliliters/minute while continuously stirring the suspension. The coated phosphor was filtered out, and washed with ethanol followed by acetone. The coated phosphor was then dried under vacuum to yield the coated phosphor powder.

Samples were prepared by the coating procedure as described above using several precursors (alkaline-earth or rare-earth compounds) as given in Table 1. Various details of experimental conditions are summarized in Table 1.

TABLE 1

| Samples | Saturated solution of $K_2SiF_6$ (g) in HF (48%) (ml) | $K_2SiF_6$:$Mn^{4+}$ phosphor in the suspension (g) | Precursor (grams) | Ethanol (ml) |
|---|---|---|---|---|
| Example 1 | 40 | 3 | 1.14 $CaCl_2$ | 60 |
| Example 2 | 60 | 3 | 1.14 $CaCl_2$ | 60 |
| Example 3 | 80 | 3 | 1.14 $CaCl_2$ | 60 |
| Example 4 | 40 | 3 | 1.14 $CaCl_2$ | 20 |
| Example 5 | 40 | 3 | 1.14 $CaCl_2$ | 40 |
| Example 6 | 40 | 3 | 1.14 $CaCl_2$ | 60 |
| Example 7 | 40 | 3 | 1.14 $SrCl_2$ | 60 |
| Example 8 | 40 | 3 | 1.25 g $MgCl_2$ | 60 |
| Example 9 | 40 | 3 | 1.39 g $YCl_3$ | 60 |
| Example 10 | 40 | 3 | 0.06 g $LaCl_3$ | 40 |

Comparative Example 1

Coated Phosphor Particles With $CaF_2$ $K_2SiF_6$:$Mn^{4+}$ phosphor powder (3 g) was added to methanol (40 mL) and this suspension was magnetically stirred at 350 rpm. $CaCl_2$ (1.14 g) was dissolved in 60 mL methanol. The resulting solution was added to the suspension (having $K_2SiF_6$:$Mn^{4+}$ phosphor powder dispersed in methanol) at a rate of 2 milliliters/minute while continuously stirring the suspension. The stoichiometrically calculated amount of HF (48%) was also added to the suspension at 2 ml/min. The resulting coated phosphor was filtered out, and washed with ethanol or methanol followed by acetone. The coated phosphor was then dried under vacuum to yield the resulting coated phosphor powder.

Figure 2:
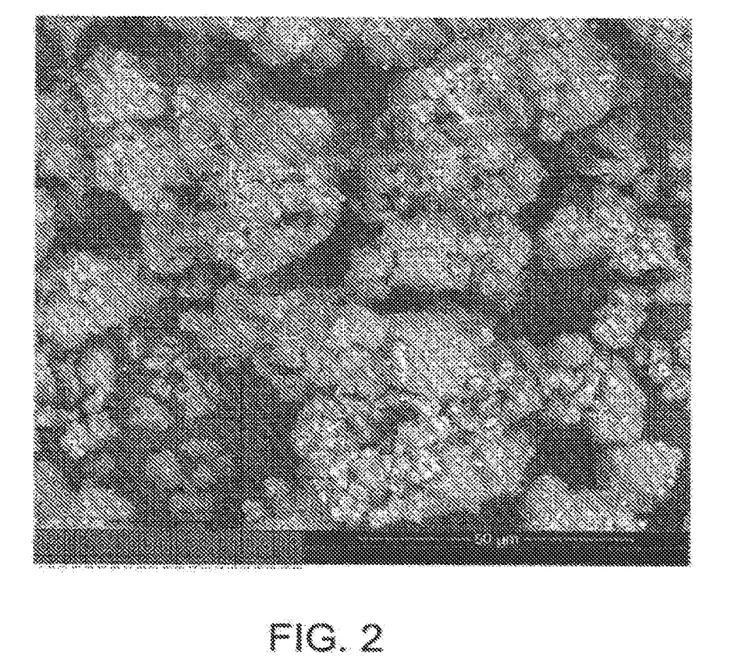
FIG. 2 is a scanning electron micrograph of coated phosphor particles with a manganese-free composite coating prepared by a process in accordance with one embodiment.
Figure 3:
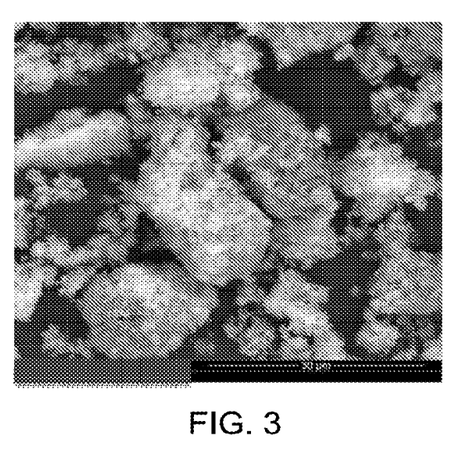
FIG. 3 is a scanning electron micrograph of coated phosphor particles with a manganese-free composite coating prepared by a process in accordance with another embodiment.
Figure 4:
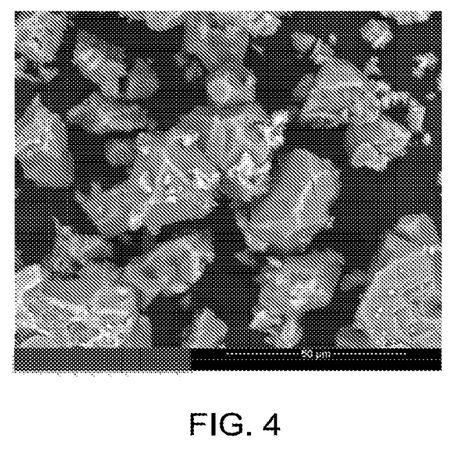
FIG. 4 is a scanning electron micrograph of coated phosphor particles of Comparative Example 1.

The samples prepared in Examples 1-10 and Comparative Example 1 were examined using a scanning electron microscope (SEM) and X-ray diffraction (XRD). FIGS. 2, 3, and 4 show SEM images of samples prepared in Example 1, Example 7, and Comparative Example 1, respectively. It can be clearly seen from the SEM images that samples of Examples 1 and 7 include coated phosphor particles that is uniformly coated by a composite coating ($K_2SiF_6$ and $CaF_2$/$SrF_2$) in contrast to the sample of Comparative Example 1 that includes $CaF_2$ coated phosphor particles. Moreover, XRD results showed that the manganese content on the surfaces of the coated phosphor particles of the samples of Examples 1 and 7 were comparatively lower than that of the $CaF_2$ coated phosphor particles of the Comparative Example 1. The $CaF_2$ coated phosphor particles of the comparative Example 1 had more than 5 times higher manganese content than that of the coated phosphor particles of the samples of Examples 1 and 7. These results further indicated that coated phosphor particles of the samples of Examples 1 and 7 were coated more uniformly by the composite coating (including $K_2SiF_6$ and $CaF_2/SrF_2$) as compared to that of the $CaF_2$ coated phosphor particles of the Comparative Example 1.

Table 2 shows QEs and change in QEs (or drop in QE) of tapes prepared using samples of Example 1, Comparative Example 1, and Comparative Example 2 prior to and after exposure to HTHH environment for 75 hours.

TABLE 2

| Sample Tapes | Coating Composition | QE prior to HTHH exposure | QE after HTHH exposure after 75 hours | Drop in QE % |
|---|---|---|---|---|
| Example 1 | $CaF_2 + K_2SiF_6$ | 99.6 | 97.4 | 2.2 |
| Comparative Example 1 | $CaF_2$ | 60 | 46.6 | 22 |
| Comparative Example 2 | Uncoated | 92.7 | 86.1 | 7.1 |

As shown in Table 2, a change in QE of the sample of Comparative Example 1 was 22% and a change in QE of the sample of Comparative Example 2 was 7% after HTHH exposure for 75 hours. These results implied that $CaF_2$ coated phosphor of Comparative Example 1 was significantly degraded after HTHH exposure. However, change in QE of the sample of Example 1 (having coated phosphors with the composite coatings) was 2.2% after HTHH exposure for 75 hours, which is much lower than the change in QEs of the samples of Comparative Examples 1 and 2.

Further, Table 3 shows QEs and changes in QEs of the samples of Examples 1, 7, 8, 9, and 10 as compared to the sample of Comparative Example 2 prior to and after exposure to HTHH conditions for 140 hours.

TABLE 3

| Sample Tape | Coating Composition | QE prior to HTHH exposure | QE after HTHH exposure after 140 hrs | Drop in QE % |
|---|---|---|---|---|
| Example 1 | $CaF_2 + K_2SiF_6$ | 96 | 82 | 14.7 |
| Example 7 | $SrF_2 + K_2SiF_6$ | 96.6 | 85.3 | 11.7 |
| Example 8 | $MgF_2 + K_2SiF_6$ | 97.4 | 90.8 | 6.7 |
| Example 9 | $LaF_3 + K_2SiF_6$ | 97.3 | 84.4 | 13.3 |
| Example 10 | $CaF_2 + K_2SiF_6$ | 98 | 85.3 | 13 |
| Comparative Example 2 | Uncoated | 96.7 | 69.4 | 28.2 |

Table 3 shows that the changes in QEs of the samples of Examples 1, 7, 8, 9, and 10 were significantly lower (≤half) than the change in QE of the sample of Comparative Example 2 (having uncoated phosphor particles) after HTHH exposure for 140 hours. These results showed that the coated phosphor particles with the composite coating (samples of Examples 1, 7-10) had comparatively higher stability in the HTHH environment than that of the uncoated phosphor of Comparative Example 2.

Examples 11-19

Coated Phosphor Particles With a Composite Coating: Aqueous/Non-Organic Solvent

Example 11

Magnesium hexafluorosilicate hexahydrate (1.8036 grams, 6.571 mmol) was mixed with 4 mL of deionized water. The mixture was filtered through a 0.45 µm membrane and then diluted with 4 mL of 35% aqueous $H_2SiF_6$ to afford Solution A. Separately, 8 mL of 49% aqueous HF was added to a plastic 20 mL vial containing a stir bar. With vigorous stirring, 2 mL of Solution A was added to the HF solution. Copious amounts of white precipitate were formed.

Example 12

8 mL of 49% aqueous HF saturated with $K_2SiF_6$ was added to a plastic 20 mL vial containing a stir bar. With vigorous stirring, 2 mL of Solution A (from Example 1) was added to the HF solution. Copious amounts of white precipitate were formed.

Example 13

8 mL of 49% aqueous HF saturated with $K_2SiF_6$ was added to a plastic 20 mL vial containing a stir bar. With vigorous stirring, 2 mL of a solution comprising 1 mL deionized water and 1 mL of 35% aqueous $H_2SiF_6$ was added to the HF solution. A small amount of precipitate was formed.

Example 14

$K_2SiF_6:Mn^{4+}$ was annealed at 540° C. and then treated with a saturated $K_2SiF_6$ solution as follows: A solution of 49% aqueous HF saturated with $K_2SiF_6$ (50 mL) was added to $K_2SiF_6:Mn^{4+}$ (5 g) in a 100 mL plastic beaker containing a stir bar. The mixture was stirred vigorously for 30 seconds and then the stirring rate was reduced. After 20 minutes of stirring at room temperature, the stirring was stopped and the reaction mixture was allowed to settle. The supernatant was decanted. The wet powder was filtered, washed with acetone and dried under vacuum. The dry powder was sieved through a 170 mesh membrane.

Example 15

$K_2SiF_6:Mn^{4+}$ prepared in Example 14 was treated a second time as described in Example 14.

Example 16

Magnesium hexafluorosilicate hexahydrate (3.6072 grams, 13.14 mmoles) was mixed with 8 mL of deionized water. The mixture was filtered through a 0.45 µm membrane and then diluted with 8 mL of 35% aqueous $H_2SiF_6$ to afford solution B. Separately, 5 grams of the product from Example 14 were added to a 100 mL plastic beaker containing a stir bar. A 45 mL solution of 49% aqueous HF saturated with $K_2SiF_6$ was added. The mixture was stirred vigorously for 30 seconds and then the stirring rate was reduced. Solution B (5 mL, comprising 4.03 mmoles of $MgSiF_6$) was added dropwise over 9 minutes to the stirring mixture of $K_2SiF_6:Mn^{4+}$. After 20 minutes total, the stirring was stopped and the reaction mixture was allowed to settle. The supernatant was decanted. The wet powder was filtered, washed with acetone and dried under vacuum. The dry powder was sieved through a 170 mesh membrane. The moles of $MgSiF_6$ added to the $K_2SiF_6:Mn^{4+}$ was equal to the number of moles in 250 mg of $MgF_2$ (5% of the weight of the starting $K_2SiF_6:Mn^{4+}$ [5% of 5 g=250 mg $MgF_2$=4.03 mmoles).

Example 17

Five grams of the product from Example 14 were added to a 100 mL plastic beaker containing a stir bar. A 40 mL solution of 49% aqueous HF saturated with $K_2SiF_6$ was added. The mixture was stirred vigorously for 30 seconds and then the stirring rate was reduced. Solution B (10 mL, comprising 8.06 mmoles of $MgSiF_6$) from Example 6 was added dropwise over 15 minutes to the stirring mixture of $K_2SiF_6$:$Mn^{4+}$. After 25 minutes total, the stirring was stopped and the reaction mixture was allowed to settle. The supernatant was decanted. The wet powder was filtered, washed with acetone and dried under vacuum. The dry powder was sieved through a 170 mesh membrane. The moles of $MgSiF_6$ added to the $K_2SiF_6$:$Mn^{4+}$ was equal to the number of moles in 500 mg of $MgF_2$ (10% of the weight of the starting $K_2SiF_6$:$Mn^{4+}$).

Example 18

The product from Example 14 (5 grams) was added to a 100 mL plastic beaker containing a stir bar. A 50 mL solution of 49% aqueous HF saturated with $K_2SiF_6$ was added. The mixture was stirred vigorously for 30 seconds and then the stirring rate was reduced. After 20 minutes of stirring at room temperature, the stirring was stopped and the reaction mixture was allowed to settle. The supernatant was decanted. To the wet powder was added 42 mL of 49% aqueous HF saturated with $K_2SiF_6$. The mixture was stirred and then 5 mL of solution, made up as described for Solution B in Example 16, was added dropwise over 11 minutes. After 20 minutes total since the beginning of $MgSiF_6$ addition, the stirring was stopped and the reaction mixture was allowed to settle. The supernatant was decanted. The wet powder was filtered, washed with acetone and dried under vacuum. The dry powder was sieved through a 170 mesh membrane. The moles of $MgSiF_6$ added to the $K_2SiF_6$:$Mn^{4+}$ was equal to the number of moles in 250 mg of $MgF_2$ (5% of the weight of the starting $K_2SiF_6$:$Mn^{4+}$).

Example 19

The product from Example 14 (5 grams) was added to a 100 mL plastic beaker containing a stir bar. A 50 mL solution of 49% aqueous HF saturated with $K_2SiF_6$ was added. The mixture was stirred vigorously for 30 seconds and then the stirring rate was reduced. After 20 minutes of stirring at room temperature, the stirring was stopped and the reaction mixture was allowed to settle. The supernatant was decanted. To the wet powder was added 42 mL of 49% aqueous HF saturated with $K_2SiF_6$. The mixture was stirred and then 5 mL of solution, made up as described for Solution B in Example 16, was added by syringe pump at a rate of 10 mL/hour). After 30 minutes total since the beginning of $MgSiF_6$ addition, the stirring was stopped and the reaction mixture was allowed to settle. The supernatant was decanted. The wet powder was filtered, washed with acetone and dried under vacuum. The dry powder was sieved through a 170 mesh membrane. The moles of $MgSiF_6$ added to the $K_2SiF_6$:$Mn^{4+}$ was equal to the number of moles in 250 mg of $MgF_2$ (5% of the weight of the starting $K_2SiF_6$:$Mn^{4+}$).

Samples of the materials prepared in Examples 15-19 were submitted for XPS analysis to determine surface composition. Sampling depth was 0.5-10 nm. The data indicated that the surface of the of the coated phosphor products was predominately $MgF_2$ with some $K_2SiF_6$.

Table 4 shows the change in QE of the materials prepared in Examples 14-19, after exposure to HTHH environment. It can be seen from Table 4 that the coated materials were more stable in the HTHH environment, with higher levels of coating, additional treatment steps, and slow addition of the precursor performing best.

TABLE 4

| Example no. | Notes | % Mn | Initial QE | QE drop after 85° C./85% RH | | | |
|---|---|---|---|---|---|---|---|
| | | | | 50 h | 100 h | 150 h | 200 h |
| 14 | Uncoated | 2.57% | 100.4% | 7.7% | 15.2% | 22.1% | 27.0% |
| 15 | Uncoated, treated 2x | 2.51% | 99.9% | 6.5% | 13.3% | 20.5% | 25.3% |
| 16 | 5 wt % Coating | 2.24% | 99.5% | 4.1% | 8.3% | 13.7% | 17.9% |
| 17 | 10 wt % Coating | 2.21% | 99.0% | 3.7% | 6.1% | 8.8% | 11.4% |
| 18 | 5 wt % Coating, treated 2x | 2.20% | 99.6% | 3.6% | 6.6% | 11.5% | 15.2% |
| 19 | Slow addition; 5 wt % Coating, treated 2x | 2.21% | 99.8% | 4.5% | 7.2% | 10.7% | 12.3% |

| Example no. | Sample code |
|---|---|
| 14 | C103015-TGAT(161)F1934-30-C |
| 15 | C103015-TGAT(161)F1934-31-T |
| 16 | C103015-TGAT(161)F1934-30-Mg5 |
| 17 | C103015-TGAT(161)F1934-30-Mg10 |
| 18 | C103015-TGAT(161)F1934-30-TMg5 |
| 19 | C103015-TGAT(161)F1934-31-TPMg5 |

While only certain features of the disclosure have been illustrated and described herein, many modifications and changes will occur to those skilled in the art. It is, therefore, to be understood that the appended claims are intended to cover all such modifications and changes as fall within the true spirit of the invention.

The invention claimed is:
1. A process comprising:
    combining a phosphor of formula I in particulate form with a first solution comprising a compound of formula II to form a suspension; and combining a second solution with the suspension, the second solution comprising a precursor comprising an element selected from the group consisting of calcium, strontium, magnesium, barium, yttrium, scandium, lanthanum, and combinations thereof,

$$A_x[MF_y]:Mn^{4+} \quad (I)$$

$$A_x[MF_y] \quad (II)$$

wherein

A is Li, Na, K, Rb, Cs, or a combination thereof;

M is Si, Ge, Sn, Ti, Zr, Al, Ga, In, Sc, Hf, Y, La, Nb, Ta, Bi, Gd, or a combination thereof;

x is an absolute value of a charge of the $[MF_y]$ ion; and y is 5, 6 or 7.

2. The process according to claim 1, wherein the precursor additionally comprises an anion selected from halide, hydroxide, nitrate, acetate, $MF_y$, or a combination thereof.

3. The process according to claim 1, wherein the precursor is calcium chloride, strontium chloride, magnesium chloride, yttrium chloride, lanthanum chloride, scandium chloride, $MgSiF_6$, $CaSiF_6$, $BaSiF_6$, $SrSiF_6$, or a combination thereof.

4. The process according to claim 1, wherein the second solution additionally comprises an organic solvent selected from the group consisting of methanol, ethanol, isopropyl alcohol, dimethylsulfoxide, acetonitrile, and combinations thereof.

5. The process according to claim 1, wherein the second solution is free of an organic solvent.

6. The process according to claim 1, wherein the first solution further comprises hydrofluoric acid.

7. The process according to claim 1, wherein the precursor comprises magnesium.

8. The process according to claim 1, further comprising contacting the phosphor of formula I in particulate form with a fluorine-containing oxidizing agent in gaseous form at an elevated temperature prior to combining the phosphor of formula I with the first solution.

9. The process according to claim 1, wherein the phosphor of formula I is $K_2SiF_6:Mn^{4+}$.

10. The process according to claim 1, wherein $K_2SiF_6:Mn^{4+}$ is combined in particulate form with a first solution comprising $K_2SiF_6$ and hydrofluoric acid to form a suspension; and a second solution is combined with the suspension, the second solution comprising a precursor selected from the group consisting of calcium chloride, strontium chloride, magnesium chloride, lanthanum chloride, yttrium chloride, scandium chloride, $MgSiF_6$, $CaSiF_6$, $SrSiF_6$, $BaSiF_6$, and combinations thereof.

11. A process comprising combining $K_2SiF_6:Mn^{4+}$ in particulate form in a first solution comprising $K_2SiF_6$ and aqueous hydrofluoric acid, to form a suspension; and combining a second aqueous solution of a precursor of formula $M'SiF_6$ with the suspension, wherein M' is Mg, Ca, Ba, Sr, or a combination thereof.

12. The process according to claim 11, wherein the compound of formula $M'SiF_6$ is $MgSiF_6$.

13. A population of particles having a core comprising a phosphor of formula I and a manganese-free composite coating disposed on the core, the manganese-free composite coating comprising a compound of formula II and a metal fluoride selected from the group consisting of calcium fluoride, strontium fluoride, magnesium fluoride, yttrium fluoride, scandium fluoride, lanthanum fluoride, and combinations thereof, $$A_x[MF_y]:Mn^{4+} \quad (I)$$

$$A_x[MF_y] \quad (II)$$

wherein

A is Li, Na, K, Rb, Cs, or a combination thereof;

M is Si, Ge, Sn, Ti, Zr, Al, Ga, In, Sc, Hf, Y, La, Nb, Ta, Bi, Gd, or a combination thereof;

x is an absolute value of a charge of the $[MF_y]$ ion; and y is 5, 6 or 7.

14. The population of particles according to claim 13, wherein the phosphor of formula I is $K_2SiF_6:M^{4+}$.

15. The population of particles according to claim 13, wherein the compound of formula II is $K_2SiF_6$.

16. The population of particles according to claim 13, wherein an amount of the manganese-free composite coating relative to the phosphor of formula I in the core ranges from 1-20%, wt/wt.

17. The population of particles according to claim 16, wherein the amount of the manganese-free composite coating relative to the phosphor of formula I in the core ranges from 5-15%, wt/wt.

18. The population of particles according to claim 13, wherein the phosphor of formula I is $K_2SiF_6:M^{4+}$ and the composite coating comprises $K_2SiF_6$ and $MgF_2$.

19. A lighting apparatus comprising a semiconductor light source and the population of particles in accordance with claim 12.

20. A backlight device comprising the lighting apparatus according to claim 19.

21. The backlight device according to claim 20, wherein the backlight device is a television, computer monitor, mobile phones, conventional telephone, digital photo frame, tablet, laptop, automotive display, e-book reader, electronic dictionary or gaming device.

* * * * *